US008536868B2

(12) United States Patent
Zenge

(10) Patent No.: US 8,536,868 B2
(45) Date of Patent: Sep. 17, 2013

(54) MAGNETIC RESONANCE PROJECTION ANGIOGRAPHY WITH CONTINUOUS TABLE DISPLACEMENT

(75) Inventor: Michael Zenge, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 657 days.

(21) Appl. No.: 12/731,332

(22) Filed: Mar. 25, 2010

(65) Prior Publication Data

US 2010/0244829 A1 Sep. 30, 2010

(30) Foreign Application Priority Data

Mar. 25, 2009 (DE) .......................... 10 2009 014 903

(51) Int. Cl.
*G01V 3/00* (2006.01)
*G01R 33/48* (2006.01)
(52) U.S. Cl.
USPC ........... 324/309; 324/307; 324/318; 382/128; 600/410
(58) Field of Classification Search
USPC .. 324/300–322; 600/407–465; 382/128–131
See application file for complete search history.

(56) References Cited

U.S. PATENT DOCUMENTS

| 7,312,610 | B2* | 12/2007 | Harder ........................... | 324/307 |
| 7,528,601 | B2* | 5/2009 | Fautz et al. .................... | 324/307 |
| 7,701,214 | B2* | 4/2010 | Kurokawa et al. ............ | 324/318 |
| 2006/0020198 | A1 | 1/2006 | Riederer et al. | |
| 2007/0222442 | A1* | 9/2007 | Aldefeld et al. .............. | 324/300 |
| 2008/0024127 | A1* | 1/2008 | Nagao et al. .................. | 324/301 |
| 2009/0278535 | A1* | 11/2009 | Takizawa et al. ............. | 324/309 |
| 2009/0309595 | A1* | 12/2009 | Yatsui ........................... | 324/309 |

OTHER PUBLICATIONS

"Continuously Moving Table Data Acquisition Method for Long FOV Contrast-Enhanced MRA and Whole-Body MRI," Kruger et al., Magnetic Resonance in Medicine, vol. 47 (2002), pp. 224-231.
"Variable Field of View for Spatial Resolution Improvement in Continuously Moving Table Magnetic Resonance Imaging," Hu et al., Magnetic Resonance in Medicine, vol. 54, (2005) pp. 146-151.
Principles of Whole-Body Continuously-Moving-Table MRI, Bürnert et al., Journal of Magnetic Resonance Imaging, vol. 28 (2008) pp. 1-12.

* cited by examiner

*Primary Examiner* — Melissa Koval
*Assistant Examiner* — Emily Chan
(74) *Attorney, Agent, or Firm* — Schiff Hardin LLP

(57) ABSTRACT

In a method and apparatus for contiguous large imaging in magnetic resonance tomography given continuous table displacement and per-segment, para-sagittal and/or para-coronal FOV relative to the table displacement direction, a sagittal and/or coronal magnetic resonance tomography overview image is/are acquired with table displacement direction in the longitudinal direction of the body and planning FOV by circumscribing the anatomical region of interest depicted in the respective overview image, for example a vessel tree. The arrangement of 2D or 3D RF excitation volumes to be radiated is planned such that the planning FOV is completely overlapped sagitally and/or coronally by the entirety of the RF excitation volume. A segment-by-segment magnetic resonance tomographical measurement of the entire 2D or 3D region defined by the RF excitation volume ensues on the basis of temporally following, slice-selective radio-frequency excitation pulses during continuous table displacement. At least two of the 2D or 3D RF excitation volumes are shifted para-sagitally and/or para-coronally against one another, with the focal point of an RF excitation volume being on the center line of the planning FOV.

9 Claims, 6 Drawing Sheets

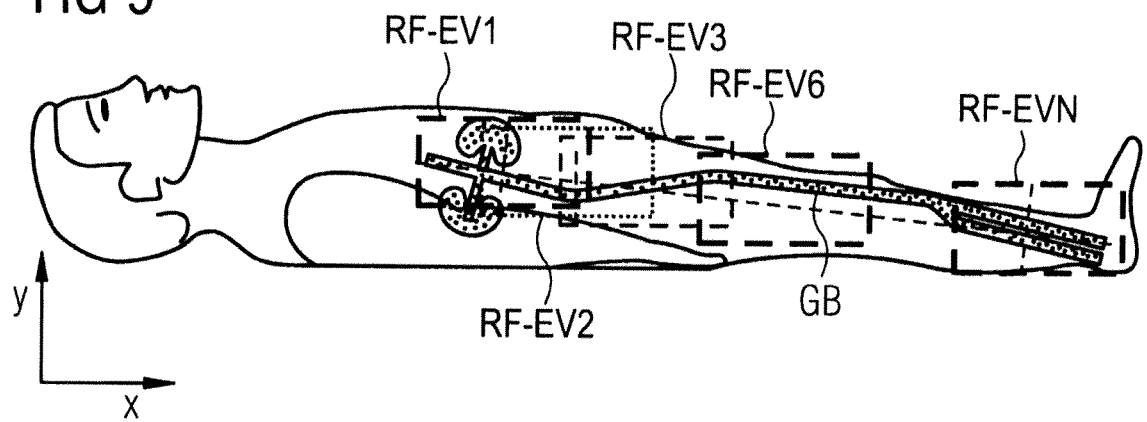
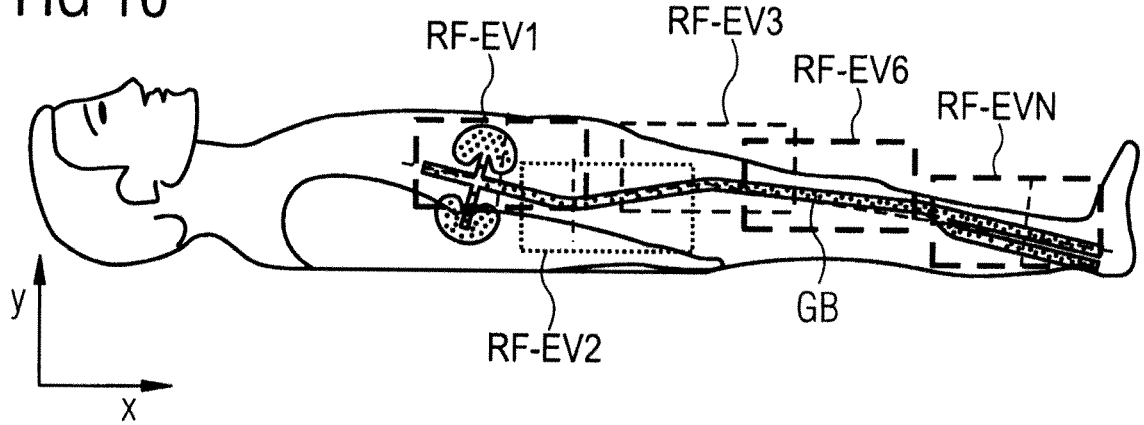

MAGNETIC RESONANCE PROJECTION ANGIOGRAPHY WITH CONTINUOUS TABLE DISPLACEMENT

BACKGROUND OF THE INVENTION

1. Field of the Invention

The present invention generally concerns magnetic resonance tomography (MRT) as used in medicine for the examination of patients. The present invention is in particular concerned with an acquisition technique in which the conventional MR (angiography) acquisition technique is improved with continuous table displacement.

2. Description of the Prior Art

MRT is based on the physical phenomenon of nuclear magnetic resonance and has been successfully used as an imaging method in medicine and biophysics for over 15 years. In this examination method the subject is exposed to a strong, constant magnetic field. The nuclear spins of the atoms in the subject, which previously were randomly oriented, thereby align. Radio-frequency energy can now excite these "ordered" nuclear spins to a specific oscillation. This oscillation generates the actual measurement signal in MRT which is received by means of suitable acquisition coils. The measurement sub can be spatially coded in all three spatial directions by the use of spatially linearly variable magnetic fields generated by gradient coils, which is generally designated as "spatial coding".

The acquisition of the data in MRT ensues in k-space (frequency space). The MRT image in image space is linked with the MRT data in k-space by Fourier transformation. The spatial coding of the subject which spans k-space ensues by means of gradients in all three spatial directions. The slice selection (establish an acquisition slice in the subject, for example the z-axis), the frequency coding (establish a direction in the slice, for example the x-axis) and the phase coding (determine the second dimension within the slice, for example the y-axis) are thereby differentiated. Moreover, the selected slice can be subdivided into partitions in 3D imaging via additional phase coding, for example along the z-axis.

A slice (for example in the z-direction) is thus initially excited, and a phase coding in, for example, the x-direction is possibly implemented. The coding of the spatial information in the slice ensues via a combined phase coding and frequency coding by means of these two aforementioned orthogonal gradient fields that, in the example of a slice excited in the z-direction, are generated in the x-direction and y-direction by the (likewise aforementioned) gradient coils.

In order to measure an entire slice of the subject to be examined, the imaging sequence (for example gradient echo sequence, FLASH) is repeated N times for different values of the phase coding gradients (for example $G^y$). The time interval of the respective excited RF pulses is thereby designated as a repetition time TR. The magnetic resonance signal (for example gradient echo signal) is likewise scanned in the presence of the readout gradient $G^F$, digitized and stored N times at equidistant time steps $\Delta t$ in each sequence pass. In this way a number matrix (matrix in k-space or k-matrix) generated line for line with N×N data points is obtained. From this data set an MR image of the considered slice with a resolution of N×N pixels can be reconstructed from this data set via a Fourier transformation (a symmetrical matrix with N×N points is only one example; asymmetrical matrices can also be generated). For physical reasons the values in the region of the center of the k-matrix primarily contain information about the contrast; the values in the border region of the k-matrix predominantly contain information with regard to the resolution of the transformed MRT image.

Slice images of the human body can be acquired in all directions in the manner just described above. MRT as a slice image method in medical diagnostics is primarily characterized as a "non-invasive" examination method. Nevertheless, particularly in angiographic acquisitions (i.e. acquisitions of the blood vessels in the human body, especially in perfused organs) limits are set on the contrast level in non-enhanced MR imaging. The contrast level, however, can be significantly enhanced by the use of contrast agent. The use of contrast agents in magnetic resonance tomography is generally based on effecting the parameters that are significant to the contrast, for example the longitudinal and transversal relaxation times $T_1$ and $T_2$. In clinical application, trivalent gadolinium $Gd^{3+}$—that has a T1-shortening effect—has become established. By integration into chelate complexes (DTPA, diethylentriaminepentaacetic acid), gadolinium loses its toxicity, such that Gd-DTPA can normally be administered intravenously. A vein is chosen that leads directly to the heart, which ultimately distributes the contrast agent in the entire arterial system (normally from the aortic arch to the tips of the toes). In prevalent sequences ($T_1$-weighted spin echo sequence, gradient echo sequence etc.) the accelerated $T_1$ relaxation produces an increase of the MR signal, thus a lighter depiction of the appertaining tissue in the MR image. In this way sharp and high-contrast images can be measured, for example of the head, neck, heart or kidney vessels.

Such a contrast agent-assisted method in magnetic resonance tomography is generally designated as "contrast-enhanced angiography" (Contrast Enhanced MR Angiography, CE MRA). The quality of contrast agent-assisted vessel exposures essentially depends on the temporal coordination of the sequence steps characterizing the measurement, which is generally designated as timing or contrast agent timing. The decisive sequence steps are: contrast agent injection; measurement duration and measurement of the center of the k-space matrix. In order to achieve an optimally good contrast of the acquisition, it is sought that a maximum contrast agent concentration in the region of interest that is to be acquired (FOV, field of view) is present during the measurement of the middle region of the k-matrix. For this reason a contrast-enhanced angiography according to the prior art is implemented as follows.

A contrast agent is intravenously injected into the body, and the contrast agent distributes uniformly through the arterial vessel system via the heart (in particular from the aortic arch to the ends of the feet). It is sought to track the contrast agent enrichment (also designated as a "bolus") by means of an MR measurement by blocks of the body region being successively excited in the FOV of interest. After the measurement of a block, the patient is shifted by, for example, the block width in the head direction by table displacement, and a new vessel segment in the form of a next block of the same direction is excited and measured. The measurement of a 3D block with, for example, a width of 10 to 15 cm given a FOV of 400 to 500 mm leads to an acquisition time from 10 to 20 s per station, such that the measurement of the entire body from the heart to the ends of the feed amounts to approximately 1 to 1.5 minutes.

This step-by-step, multi-station, whole-body imaging has certain disadvantages: valuable time that is actually necessary for data acquisition is lost due to the time that the table displacement requires. Valuable measurement time is likewise lost because a steady-state signal must first be established at every station, and the FOVs of a station (table position) overlap must with its neighboring stations (in order to ensure a seamless depiction of the anatomy as a whole), which leads to a data acquisition that is redundant in part. A signal decline at the edges of each partial image volume (due to deficiencies of the RF coils) also leads to disruptive signal inhomogeneities in the total FOV. An additional disadvantage of this technique is that gradient nonlinearities lead to geometric distortions at the edges of the respective partial volumes and result in border artifacts between adjacent blocks.

In order to solve these problems, a method that allows the acquisition of a homogeneous, high-contrast, contiguous large MR image—thus an MR image of an expanded field of view ($FOV_{tot}$)—is proposed by Krugel et al., wherein the patient table is moved continuously during the scan (Kruger et al.; Journal of Magnetic Resonance in Medicine 2002 February; 47 (2): 224-231). According to this method, all acquired MRT data are corrected for a common table reference position, whereby a single, seamless MRT image can be reconstructed. As stated, a single MRT image can be generated in this way over a spatial region which far exceeds the normal FOV of the MRT apparatus. The patient is moved continuously through the MRT apparatus, and both table and views are simultaneously acquired. Every view is corrected according to position using the associated table position data in order to generate an individual table matrix of MRT data, which is used for image reconstruction. This technique is designated by some manufacturers as "TIM Technology" (Total Imaging Matrix, TIM) or "TIMCT" (TIM with Continuous Table Movement).

However, the aforementioned method is limited because the scanning in the readout direction (frequency coding direction) has to ensue exclusively in the table movement direction. The method according to Kruger et al. has the disadvantage that only 2D slices or 3D volumes with coronal or sagittal orientation can be excited and measured by MR as a planning FOV ($FOV_{tot}$ or presentation region or target volume) and as a partial FOV (also called "RF excitation volume, RF-EV" for the respective phase coding step in the following).

A rectangular planning FOV in a sagittal slice of a patient is shown in FIG. 2. FIG. 3 shows a number of likewise rectangular RF excitation volumes (RF-EVs) strung along in series or partially overlapping via which the planning FOV is optimally and completely covered (overlapped). From FIG. 3 it is clear that a measurement of the planning FOV ($FOV_{tot}$) ensues with multiple technically realizable, smaller RF excitation volumes. An overlapping of these small RF excitation units among one another and with the space outside the planning FOV is possible. Finally, the Fourier-transformed segments of the respective phase coding steps that have occurred in the table displacement direction (here the x-direction) are shown in FIG. 4, sorted in the x-$k_y$ hybrid space at the respective, actual pixel position. Each of these segments HA represents one RF excitation that corresponds to a phase coding step, wherein an RF excitation volume according to FIG. 3 is associated with each of these phase coding steps; HA1 corresponds to RF-EV1, HA2 corresponds to RF-EV2 etc. An additional phase coding in the z-direction ensues given a 3D overlapping.

In contrast agent-based MRT methods (CE-MRA methods; Contrast Enhanced Magnetic Resonance Angiography) large horizontal segments sometimes must be measured (for example from the head or heart to the extremities, hands or feet). These are thus segments in which the vessels to be imaged (for example a vessel tree consisting of veins) can also have a sagittal and/or coronal course component (for example a vertical and/or horizontal course component as viewed from a sagittal or coronal viewing direction) in a direction orthogonal to the longitudinal patient axis (depending on the view, for example radially in the sagittal plane or in the coronal plane), as well as an axial course in the longitudinal patient direction. In such situations, the actual regions to be measured must be selected extremely large in the method according to Kruger et al. For the geometric reasons described above, the planning FOV according to Kruger must always be able to be registered by a rectangle parallel to the longitudinal axis of the patient or, respectively, by a corresponding parallel cuboid.

This in turn means that far more (in the worst case a multiple of) measurement data must be acquired than would actually be necessary for a mere vessel depiction. For example, in FIG. 5 a vessel tree stretching from the torso to the feet should be acquired by means of MRT angiography. A planning FOV ($FOV_{tot}2$) circumscribes the vessel tree to be acquired by means of CE-MRT measurement; although this vessel tree is only slightly angled, the method according to Kruger et al. requires more than twice as large a presentation area (target volume $FOV_{tot}^{Kruger}2$) in the sagittal slice, which can make the method according to Kruger et al. extremely inefficient. The disadvantages are longer measurement times and a high data level that must be additionally stored and evaluated. Even a planning FOV ($FOV_{tot}3$) that is better adapted to geometric course of the vessel tree (as is shown in FIG. 7) does not significantly reduce the target volume that is still required according to Kruger ($FOV_{tot}^{Kruger}3$) in comparison to the target volume $FOV_{tot}^{Kruger}2$ (FIG. 6), as is apparent from FIG. 8.

Compared to a multi-station MRT method, the method according to Kruger thus has the significant disadvantage that the MRT measurement of the respective anatomy of the patient cannot be optimally adapted, as is possible in MRT imaging with individual stations.

In order to keep this disadvantage minimal, conventionally the sagittal vertical extent or the coronal vertical extent of the total FOVs inscribing the planning FOV is reduced or minimized. This is implemented, for example, by the patient being supported substantially flat and level by means of suitable supports and cushions, which requires a laborious, and imprecise, procedure. In the case of CE angio, and therefore coronal imaging, according to the conventional technique the patient must thus be carefully supported in order to minimize the FOV in the anterior-posterior dimension.

SUMMARY OF THE INVENTION

An object of the present invention is to provide a method with which angiographic acquisition methods with continuous table displacement in magnetic resonance tomography are optimized with regard to time and data volume, the acquisition time is reduced, the spatial resolution, minimize the raw data and optimize the reconstruction time.

According to the invention, a method for contiguous large imaging in magnetic resonance tomography given a continuous table displacement and per-segment, para-sagittal and/or para-coronal FOV relative to the table displacement direction, has the following steps.

A sagittal and/or coronal magnetic resonance tomography overview image is/are acquired with table displacement direction in the longitudinal direction of the body. A planning FOV ($FOV_{tot}$) is established by circumscribing the anatomical region of interest depicted in the respective overview image, for example a vessel tree. The arrangement of 2D or 3D RF excitation volumes (RF-EV) to be radiated is planned such that the planning FOV is completely overlapped sagittally and/or coronally by the entirety of the RF excitation volume. Segment-by-segment magnetic resonance tomographical data of the entire 2D or 3D region defined by the RF excitation volume are acquired on the basis of temporally following, slice-selective radio-frequency excitation pulses during continuous table displacement.

The method is characterized by at least two of the 2D or 3D RF excitation volumes being shifted para-sagitally and/or para-coronally against one another, so the focal point of an RF excitation volume coincides with the center line of the planning FOV.

The method is advantageously executed so that a vertically occurring variation of the RF excitation volume that occurs vertically in the y-direction ensues by phase manipulation of the acquired MR data according to the equation $$\hat{S}_n(k_y, x) = S_n(k_y, x) e^{-i k_y y_n}$$

with n=1, ... N, wherein N corresponds to the number of RF excitation volumes, $S_n(k_y, x)$ represents the MR signal which is measured during a standard imaging acquisition and $e^{-i k_y y_n}$ represents the phase factor necessary for a vertical adjustment in the y-direction.

It is also advantageous for the dimensioning of the individual RF excitation volumes to be optimally, individually adapted via an input interface (for example with the computer mouse) corresponding to the dimensioning of the planning FOV according to the above points of view.

The sagittal and/or coronal width of all RF excitation volumes (but also the sagittal and/or coronal height of all excitation volumes) can be of equal size.

It can furthermore be advantageous to produce a continuously variable orientation during the table displacement outside of an orientation that is different per segment, or even to use imaging parameters (for example slice thickness, resolution etc.) that is altered per segment.

The invention also encompasses a magnetic resonance tomography apparatus that is designed to implement the method described above.

The above object also is achieved in accordance with the present invention by a non-transitory computer-readable storage medium encoded with programming instructions that, when the storage medium is loaded into a computerized control system of a magnetic resonance apparatus, cause the magnetic resonance apparatus to implement the method described above, and all embodiments thereof.

BRIEF DESCRIPTION OF THE DRAWINGS

FIG. 9 shows the MR excitation in the angled planning FOV according to FIG. 5 given continuous table displacement according to the present invention.

FIG. 10 shows the MR excitation in the optimally adapted planning FOV according to FIG. 7 given continuous table displacement according to the present invention.

DESCRIPTION OF THE PREFERRED EMBODIMENTS

Figure 1:
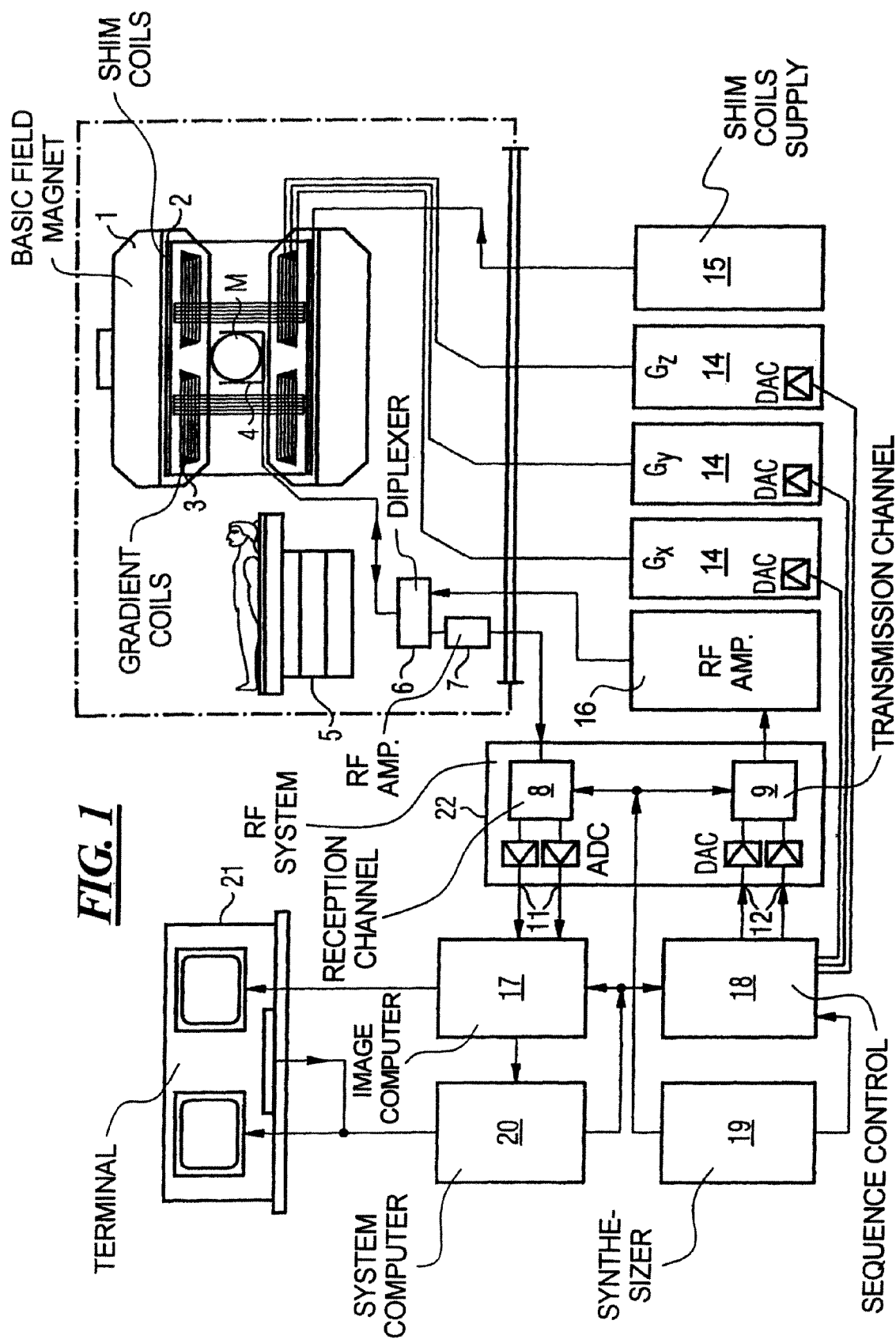
FIG. 1 schematically illustrates a magnetic resonance (MR) tomography apparatus constructed and operating in accordance with the invention.

FIG. 1 is a schematic illustration of a magnetic resonance tomography apparatus with improved projection angiography acquisition technique according to the present invention. The basic design of the magnetic resonance tomography apparatus corresponds to that of a conventional tomography apparatus, with the differences described below. A basic field magnet 1 generates a temporally constant strong magnetic field to polarize or align the nuclear spins in the examination region of a subject, for example a part of a human body that is to be examined. The high homogeneity of the basic magnetic field that is required for the magnetic resonance measurement (data acquisition) is defined in a spherical measurement volume M into which the parts of the human body that are to be examined are introduced. Shim plates made of ferromagnetic material are mounted at suitable locations to assist the homogeneity requirements and in particular to eliminate temporally invariable influences. Temporally variable influences are eliminated by shim coils 2 that are activated by a shim power supply 15.

A cylindrical gradient coil system 3 that is composed of three sub-windings is located in the basic field magnet 1. Each sub-winding is supplied by an amplifier 14 with current to generate a linear gradient field along a defined direction of the Cartesian coordinate system. A first sub-winding of the gradient field system 3 generates a slice-selection gradient $G_S$, a second sub-winding generates a frequency coding gradient $C_F$ and a third sub-winding generates a phase coding gradient $G_P$. According to the invention, the frequency coding gradient $C_F$ lies in the left-right direction relative to the patient given a coronary projection, while the other two gradients—slice-selection gradient $G_S$ and phase coding gradient $G_P$—are applied in the same direction, namely in the direction of the longitudinal axis of the body. The reason for such a gradient arrangement according to the invention is explained in more detail below.

Furthermore, each amplifier 14 has a digital-analog converter that is activated by a sequence controller 18 for accurately-timed generation of gradient coils.

Within the gradient field system 3 is located a radio-frequency antenna 4 that converts the radio-frequency pulses output by a radio-frequency power amplifier 30 into an alternating magnetic field for the excitation of the nuclei to displace the nuclear spins of the subject to be examined, or the region of the subject that is to be examined, from the alignment imposed by the basic magnetic field. The alternating field emanating from the precessing nuclear spins (i.e. normally the spin echo signals caused by a pulse sequence composed of one or more radio-frequency pulses and one or more gradient pulses) is also converted by the radio-frequency antenna 4 into a voltage that is supplied via an amplifier 7 to an radio-frequency acquisition channel 8 of a radio-frequency system 22. The radio-frequency system 22 furthermore has a transmission channel 9 in which the radio-frequency pulses for the excitation of magnetic resonance are generated. The respective radio-frequency pulses are digitally represented in the sequence controller 18 as a series of complex numbers due a pulse sequence provided by the system computer 20. This number series is supplied as a real part and imaginary part via respective inputs 12 to a digital-analog converter in the radio-frequency system 22 and from this to a transmission channel 9. In the transmission channel 9 the pulse sequences are modulated on a radio-frequency carrier signal having a base frequency that corresponds to the resonant frequency of the nuclear spins in the measurement volume.

The switching from transmission mode to acquisition mode ensues via a transmission/reception diplexer 6. The radio-frequency antenna 4 radiates the radio-frequency pulses into the measurement volume M to excite the nuclear spins and detects the resulting echo signals. The detected (received) magnetic resonance signals are phase-sensitively demodulated in the acquisition channel 8 of the radio-frequency system 22 and are converted via a respective analog-digital converter into a real part and an imaginary part of the measurement signal. An image is reconstructed by an image computer 17 from the measurement data that are obtained in this manner. The administration of the measurement data, the image data and the control programs ensues via the system computer 20. Based on a specification with control programs, the sequence controller 18 monitors the generation of the respective desired pulse sequences and the corresponding scanning of k-space. In particular, the sequence controller 18 controls the timed switching of the gradients, the emission of the radio-frequency pulses with defined phase and amplitude and the acquisition of the magnetic resonance signals. The time base for the radio-frequency system 22 and the sequence controller 18 is provided by a synthesizer 19. The configuration of the MRT apparatus, the selection of corresponding control programs for generation of a magnetic resonance image, and the presentation of the generated magnetic resonance image ensue via a terminal 21 that has a keyboard and one or more monitors.

The user can call up different cards (pop-ups) on the monitor of the terminal 21, with which the user can configure the MRT apparatus accordingly. These cards are generated by the system computer 20. In such cards, input windows are displayed in which the user can enter measurement parameter values and thus can make MRT apparatus settings. These cards are thematically separated. For example, there is a CONTRAST card in which (among other things) the flip angle can be set; a ROUTINE card in which the echo time, the repetition time, the slice number can be input, for example; a RESOLUTION card in which the k-matrix can be configured; a SEQUENCE file in which the desired sequence type (gradient echo sequence, steady-state spin echo sequence, True-Fisp, EPI, FLASH etc.) can be selected, etc.

Especially in angiography acquisitions it is important to measure the respective body regions in the correct relationship with the point in time of the contrast agent injection, and therefore with the time-space (temporospatial) course of the contrast agent.

With a uniform, continuous table movement, the arterial contrast agent bolus (the contrast agent enrichment) can be tracked online (for example from the aortic arch to the tips of the feet), so a very high spatial and temporal resolution can be achieved, with no overlapping of the arterial vessel system with the venous vessel system.

Figure 11:
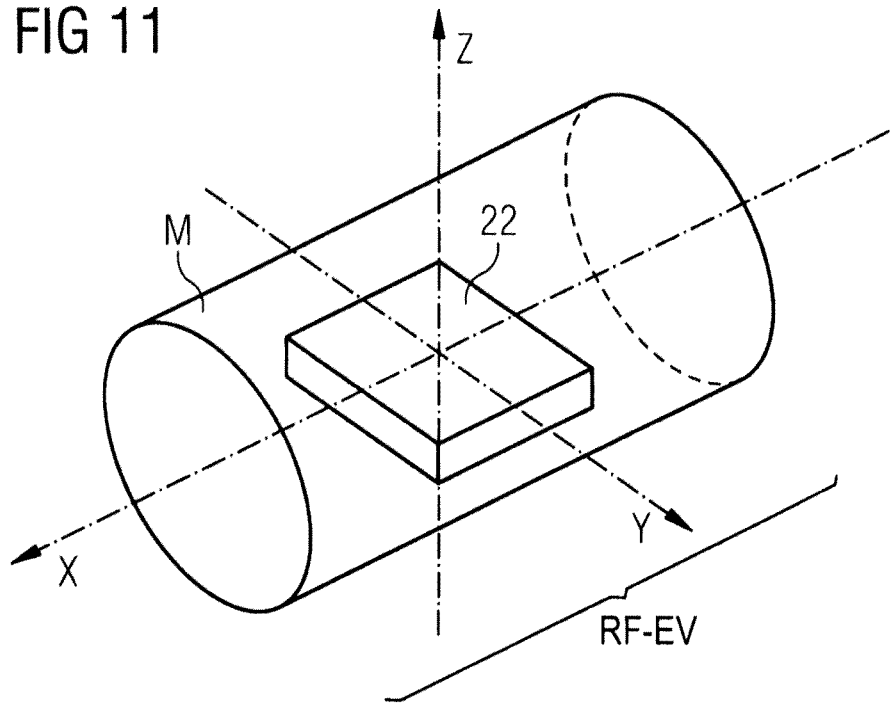
FIG. 11 schematically shows the direction relationships in the homogeneity volume of an MRT scanner.

The method according to Kruger et al. enables the subject to be imaged (given continuous table displacement) across a field of view ($FOV_{tot}$) that is larger by a multiple than can be imaged at all in conventional MRT apparatuses due to the limited size of the RF excitation volume. In the following, $FOV_{tot}$ is thus the complete desired FOV along the table movement direction (for example the x-direction) and RF-EV, is the field of view along this x-direction for every single NMR signal ($FOV_{tot}$>RF-$EV_x$; in the following the x is omitted since a table displacement in the x-direction is assumed). The data acquisition method according to Kruger et al. allows an uninterrupted scanner operation while the patient table is moved continuously through the homogeneity volume M. In the homogeneity volume M an optimal overlay of static basic magnetic field and the linear magnetic gradient fields exists and is designated as a "sweet spot" of an NMR scanner, Kruger et al. actually enables the acquisition of arbitrarily large FOVs along the table movement direction on the basis of an uninterrupted data set, wherein two- or three-dimensional MR images can be acquired. Kruger et al. is essentially directed towards MR angiography (the imaging method can be coupled with other techniques during the continuous table displacement, including with a real time MRT to provide a real time-controlled table movement and other scan parameters), but presents a general magnetic resonance tomography imaging method. To explain the method, according to FIG. 11 a layer or slice with sagittal alignment in the x-y direction (coronal alignment in the x-z direction) is assumed in the bore of the basic field magnet. The readout direction is the x-axis and likewise corresponds to the table movement direction. The slice selection direction is the z-axis (vertical and orthogonal to the x-axis). For a 2D imaging, the phase coding ensues along the y-axis; for a 3D imaging the phase coding ensues both along the y-axis and along the z-axis.

If the subject is moved through the scanner along the x-axis, MR data are acquired using the sequence of imaging pulse sequences in the slice. The readout of the coded k-space data in the x-direction ensues during each sequence repetition. The k-space data (raw data) are typically subjected to an aliasing filtering and a subsequent Fourier transformation (Fourier transformation) in the x-direction. The result is a data matrix 23 made up of storage locations (arrangement of the measurement values in 2D or 3D matrix form) in x-$k_y$ hybrid space which represents a resolution desired later in the x-, y- and z-directions. The initial views that are first transformed once in the x-direction represent data lines shifted in the x-direction in the matrix (horizontal segments, HA), wherein the displacement represents the respective patient position at whose point in time the MR signal was acquired. Naturally, the relative position of the patient table is thereby known at a fixed reference point for every MR data readout. The data acquisition is conducted until the entire data matrix 23 is complete and the patient table 5 has reached its end position. The final image is obtained via Fourier transformation along the remaining y-direction and—in the case of 3D imaging—also in the z-direction.

The measured standard MR signal can be described as follows:

$$S_n(t) = \iint m(x,y) e^{-i\gamma G_n y t_y} e^{-i\gamma G_x x t} dx dy \quad (1)$$

wherein x represents the readout direction (frequency coding direction); y represents the phase coding direction; $G_x$ and $G_n$ represent the respective gradients in the x-direction and y-direction; m(x,y) represents the transversal magnetization of the subject in the x-y spatial coordinates; γ represents the gyromagnetic ratio; and $t_y$ represents the duration of the y-gradient. The index n counts the sequence repetitions and runs from 0 to N−1, wherein N is the total number of phase codings along the y-axis.

A subject displaced from an initial position over a certain arbitrary distance has a position Δ. The signal of this displaced subject is described by $$S_n'(t) = \iint m(x-\Delta, y) e^{-i\gamma G_n y t_y} e^{-i\gamma G_x x t} dx\, dy$$

By substitution of the variables x'=x−Δ and dx'=dx, $$S_n'(t) = e^{-i\gamma G_x \Delta t} \iint m(x', y) e^{-i\gamma G_n y t_y} e^{-i\gamma G_x x' t} dx'\, dy'$$

is obtained, wherein $e^{-i\gamma G_x \Delta t}$ represents a phase term that represents the position shift of the subject in the x-direction. It is assumed that γ, $G_n$ and Δ are known for each specific phase coding. In order to make a position correction, i.e. to cancel out the position displacement of the subject in the x-direction (cancel the shift of the signal $S_n(t)$), the following inverse phase factor is required $$e^{+i\gamma G_x \Delta t}$$

There are two procedures for repositioning each MR signal:
A) the direct method, in which the shifted data are returned to their position by the inverse phase factor being applied to the continuously back-scanned, raw k-space data and
B) the time- and memory-efficient method in which a combination of phase shift and position shift is applied to the scan data.

Figure 12:
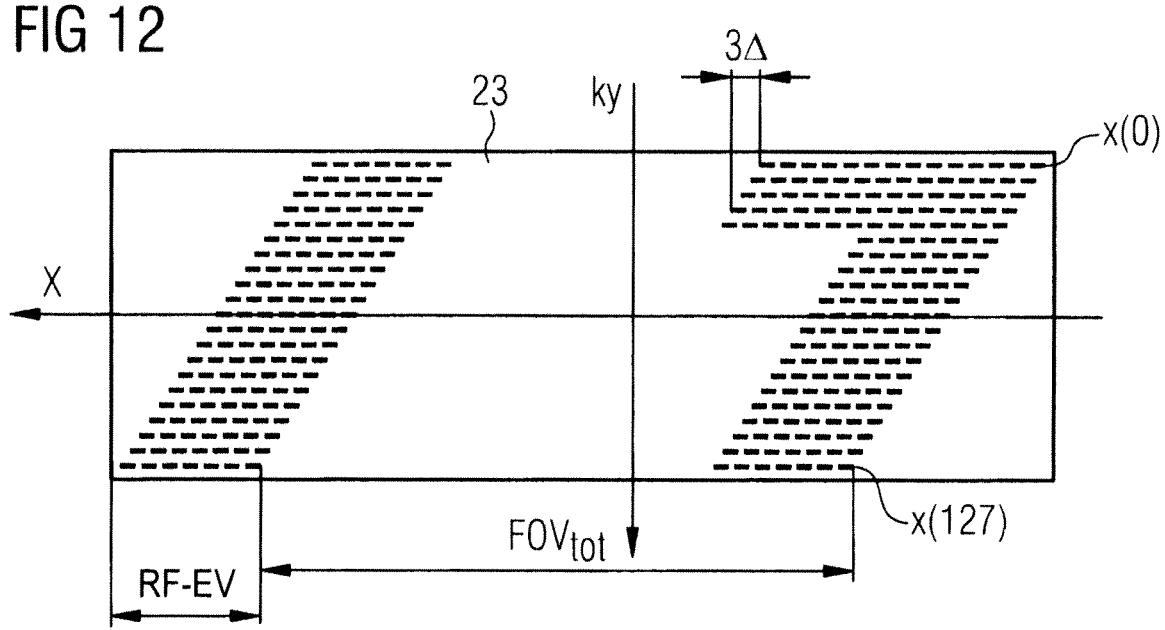
FIG. 12 schematically shows the chronological order of the acquisition of the data in a data matrix in the $k_y$-x hybrid space.

The paragraph beginning at page 20, line 3 has been amended as follows:

The position for every detected view in the data matrix 23 is determined by two factors: the respective number of the view and the position of the patient table at the point in time of the acquisition of this view. In FIG. 12 this is shown for a two-dimensional acquisition with a monotonous view sequence. The first view (the first MR data signal) is acquired at the point x(0). This same view serves as a reference position for the following process. All following views are acquired while the y-value is changed step by step (for example by 128 values) via phase shift in the y-direction. The position of an MR measurement value in the data matrix along the $k_y$-axis is therefore defined by $G_y$ phase coding for this view. As can be seen from FIG. 12, the center of all sequentially acquired MR signals is displaced not only in the $k_y$-direction but also along the x-axis after the Fourier transformation in the x-direction as a consequence of the table movement. The dimension of this displacement from the reference position x(0) results via the following equation $$x(n) = v_{ref} \cdot t$$

or, respectively, $$x(n) = v_{ref} \cdot n \cdot TR$$

wherein $v_{ref}$ is the table feed speed, t is the time already passed since the beginning of the scan, n is the number of sequence passes (likewise since the beginning of the scan) and TR is the repetition time (time of a sequence pass).

Figure 4:
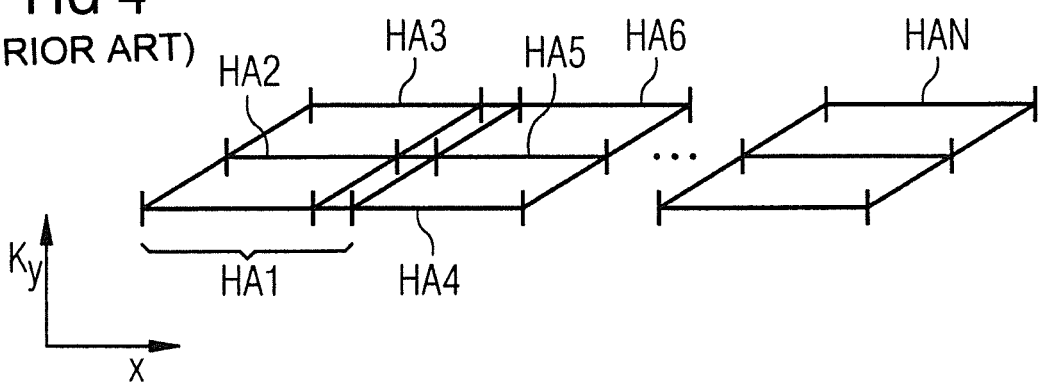
FIG. 4 shows the reconstruction scheme in the ky-x hybrid space according to Kruger et al. for the planning FOV according to FIG. 2.

Although the memory data pattern of the data matrix (defined by the geometry of the trajectory) is similar to a conventional k-space scan pattern, it differs by a noticeable asymmetry due to the table movement (parallelogram shape as already illustrated in FIG. 4). If all phase coding views of a specific $k_y$ view are acquired, the process repeats and every new view Fourier-transformed in the x-direction is linked with the previously acquired $k_y$ view. It is noted that, given a three-dimensional data acquisition, a sequence of $k_z$-phase coded views is likewise subjected to a $k_y$-phase coding, and then is shifted in the same manner within a then three-dimensional data matrix (3D matrix) and ultimately is asymmetrically stored.

Depending on the number of the phase codings and the patient table movement, in a subsequent scan in which a view for a specific phase coding is detected the placement of the scan values in the data matrix can possibly overlap or also not in the x-direction with preceding scan values. An overlap of the RF excitation volumes of successive phase coding steps (RF-EV1, RF-EV2) within a phase coding cycle cannot be precluded. For example, in FIG. 12 the time sequence is such that there are no overlapping scan values in the previously acquired view at x(0). However, a certain general overlap will occur (see the overlap of HA1 and HA4, HA2 and HA5, HA3 and HA6 etc. in FIG. 4), wherein the redundant overlapping signal scan values can then be averaged to improve the SNR.

The previously described method is characterized by an on-line tracking of the arterial contrast agent bolus (the contrast agent enrichment)—for example from the aortic arch to the tips of the feet—enabled by a uniform, continuous table movement. A very high spatial and temporal resolution can be achieved, and there is no overlapping of the arterial vessel system with the venous vessel system.

A disadvantage of this method is that the data acquisition in purely sagittal or purely coronal views (FOV and in fact both $FOV_{tot}$ and RF-EV) is horizontally limited in the table displacement direction (x-direction). This is disadvantageous because a vessel tree of interest or a longer vessel segment is not purely horizontally oriented, but rather corresponds to a naturally angled (thus non-horizontal) orientation of a patient lying on a flat table 5 of an imaging modality (MRT, CT etc.). As is apparent from FIG. 2, for example, the extension of a horizontal FOV sufficiently circumscribing the vessels of the torso, the abdomen and the alvus does not contain the vessels in the legs and in the feet. In the case of a horizontal planning FOV ($FOV_{tot}1$ identical with $FOV_{tot}^{Kruger}1$) minimized for the region of the upper body, an excitation and scan according to Kruger et al, makes an angiography of the legs and feet impossible, in spite of sufficient table displacement.

Figure 2:
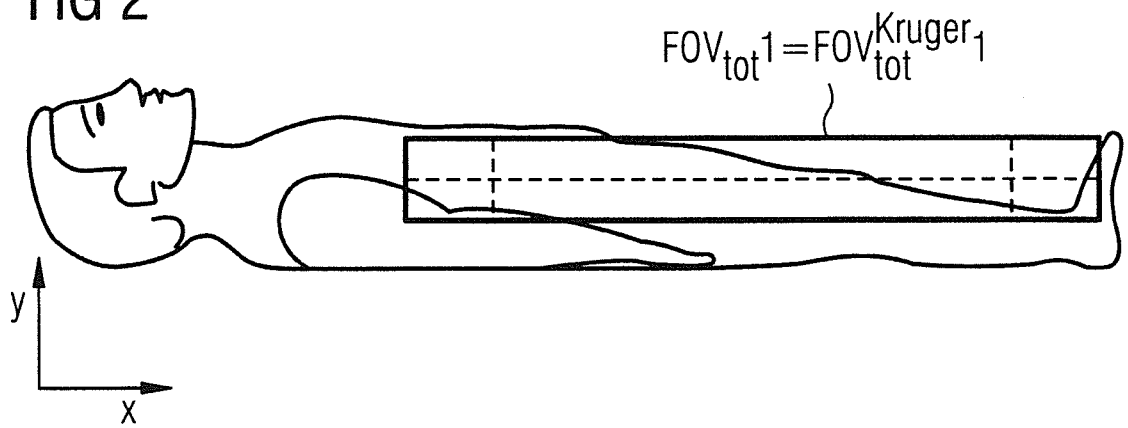
FIG. 2 schematically illustrates an MR overview image in a side view of a patient with rectangular, horizontal planning FOV.
Figure 3:
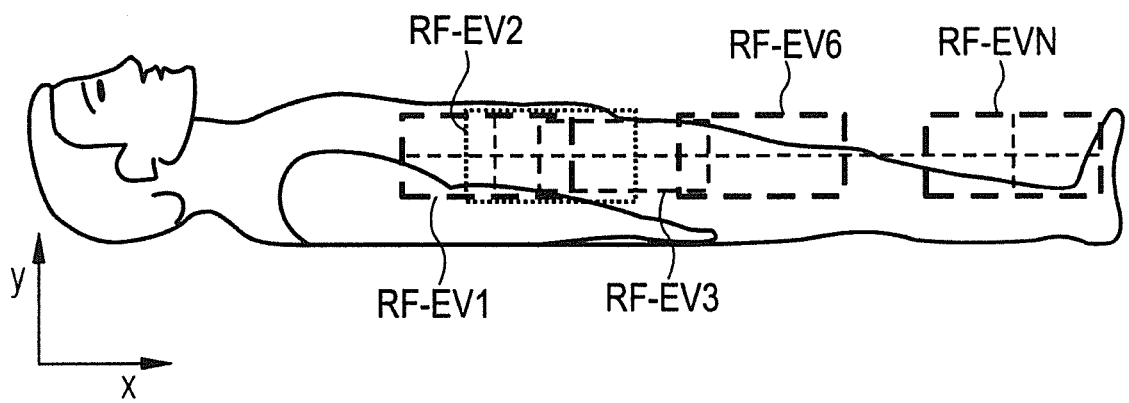
FIG. 3 shows the MR excitation in the planning FOV according to FIG. 2 by means of RF excitation volumes given continuous table displacement according to the prior art (Kruger et al.).

FIG. 2 typically represents a coronal 3D FOV in the side view (sagittal slice). However, the representation has validity both for a 2D sagittal slice with an anterior-posterior phase coding or a 2D coronal slice with a right-left phase coding and in the 3D case with an additional phase coding.

As already presented in the specification preamble, there are presently two ways to circumvent the aforementioned disadvantage:
1. Enlarge the $FOV_{tot}$ in the coronal/sagittal vertical direction
2. Optimally horizontal alignment of the patient by placing cushions underneath The former leads to a significant increase of the data volume (doubling or tripling the FOV depending on the dimension and anatomy of the respective patient); the latter is laborious and imprecise.

The present invention solves this problem by modifying the method according to Kruger et al. such that an arbitrary two-dimensional or three-dimensional planning FOV ($FOV_{tot}$) is covered by horizontally and vertically limited but displaceable 2D or 3D RF excitation volumes (RF-EV) (thus are measured overlapping via nuclear magnetic resonance, for example CE-MRA). Both the horizontal and the vertical width of an RF excitation volume are thereby set according to the coronal and/or sagittal slope and curvature relationships of the planning FOV.

Figure 5:
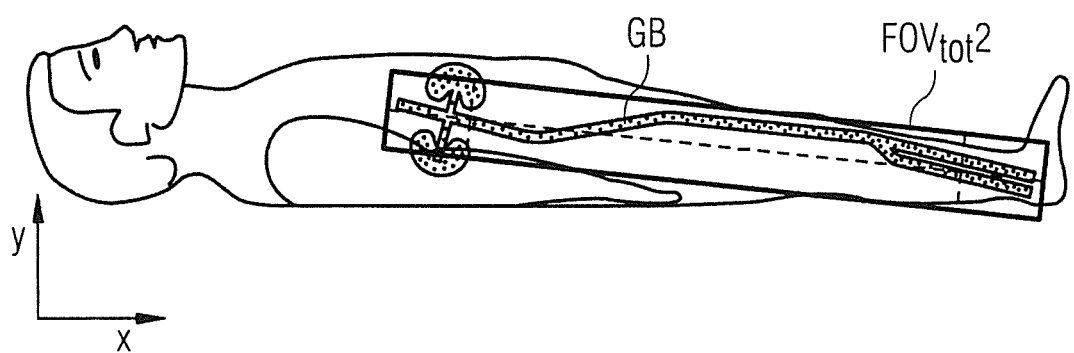
FIG. 5 schematically shows an MR overview image in a side view of a patient with rectangular planning FOV angled in the x-z plane, which sagitally circumscribes the vessel tree of interest.
Figure 6:
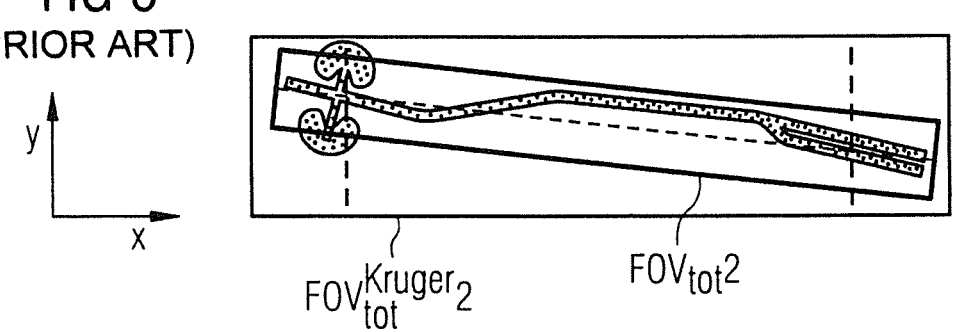
FIG. 6 shows a rectangular measurement FOV circumscribing the angled planning FOV that is necessary according to the prior art.
Figure 7:
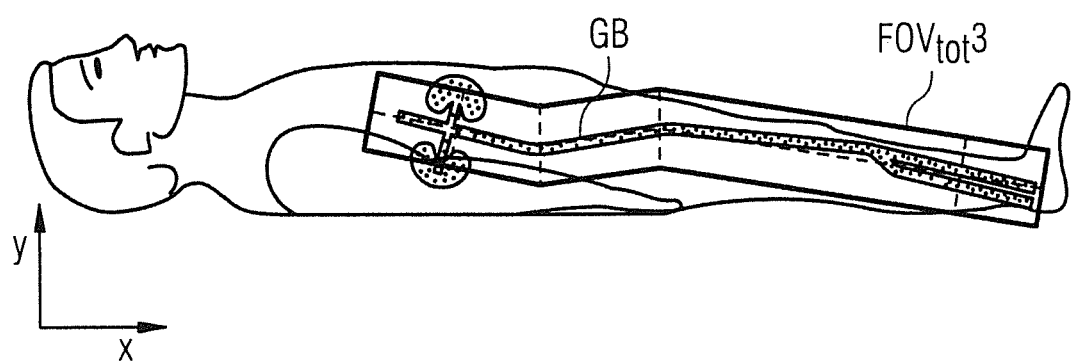
FIG. 7 schematically shows an MR overview image in a side view of a patient with planning FOV composed of contiguous segments of different shape which is optimally adapted to the sagittal course of the vessel tree of interest.
Figure 8:
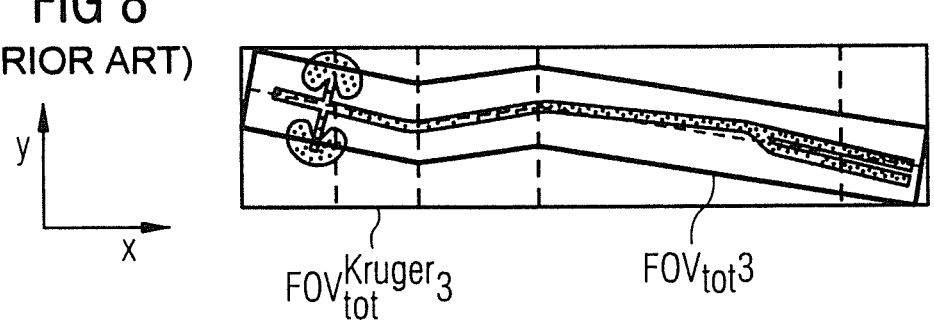
FIG. 8 shows a rectangular measurement FOV circumscribing the optimally adapted planning FOV that is necessary according to the prior art.

First an MR overview measurement is implemented that, for example, shows a slice image of the entire patient. In all accompanying Figures, a sagittal slice is selected. This overview slice image is used in order to generate an optimal planning FOV (FIGS. 2, 5, 7: $FOV_{tot}1$, $FOV_{tot}2$, $FOV_{tot}3$). This can rectangular or cuboid and additionally be angled counter to the x-axis and z-axis, or consist of such differently angled segments adjoining one another, for example depending on the course of the vessel tree of interest in the angiography. The arrangement of RF excitation volumes of the same or different sizes is subsequently planned coronally and/or sagittally depending on the geometry of the planning FOV, and in fact such that the planning FOV is covered completely by the successively radiate RF excitation volumes but with minimal cost. The coronal and/or sagittal width of all segments and all RF excitation volumes is normally advantageously selected to be equal in size.

The overlapping (or not overlapping, but then gap-free adjoining) coverage in the table displacement direction (for example horizontal direction, x-direction) ensues according to the prior art Kruger et al. described in the preceding.

The para-sagittal and/or para-coronal (for example vertical position, y-direction and/or z-direction) of the RF excitation volumes—in the following example an offset ensues exclusively in the y-direction is adjusted according to the invention by a phase factor/phase term with which the MR signal according to Kruger et al. $S_n(k_y,x)$ is additionally charged:

$$\hat{S}_n(k_y,x) = S_n(k_y,x)e^{-ik_y y_n}$$

$S_n(k_y,x)$ is the nuclear magnetic resonance signal from an n-th RF excitation volume displaced in the horizontal direction; $\hat{S}_n(k_y,x)$ is the nuclear magnetic resonance signal from the same RF excitation volume, but displaced in the y-direction (vertically), wherein the phase term $e^{-ik_y y_n}$ represents the displacement in the y-direction. The RF excitation (FOV in position space or image space) is implemented during the acquisition for each phase coding step so that the focal point of an RF excitation is congruent with the center line of the planning FOV. Therefore this offset must be accounted for as a phase term in k-space in the image reconstruction.

A trajectory running arbitrarily in the x-y plane can thus be measured by means of MR with minimal measurement cost via the combination of the uniform, continuous table feed in the x-direction according to Kruger et al. with an additional phase coding in the y-direction.

The method according to the invention should be clarified and illustrated again using FIGS. 9 and 10.

FIG. 9 shows a sagittal slice of a horizontally borne human body with a vessel tree GB reaching from the upper body to the feet. Viewed roughly, this vessel tree GB can be circumscribed by a uniform, vertically angled planning FOV ($FOV_{tot}$). The scanning of this planning FOV ensues via equally large RF excitation volumes (RF-EV1 through RF-EVN) that are horizontally and vertically offset or shifted from one another. It is noted again that an overlapping of the RF excitation volumes normally ensues. It is noted that optimization potential for the method according to the invention is to keep an overlap from one phase coding cycle (FIG. 4: HA1 to HA3) to the next (FIG. 4: HA4 to HA6) small, analogous to a multi-station method.

FIG. 10 shows how the measurement can be optimized via suitable selection of the size of the RF excitation volumes and a correspondingly varied arrangement of the same given a greater deviation of the vessel tree to be depicted (and therefore of the planning FOV) from an exactly linear course. The arrangement of the RF excitation volumes follows the wave-like course of the vessel tree in the x-direction, so to speak.

It is likewise possible to also produce a continuously varying orientation during the table displacement, outside of an orientation that is different per segment, or even to use imaging parameters (for example slice thickness, resolution etc.) that change per segment.

Although modifications and changes may be suggested by those skilled in the art, it is the intention of the inventor to embody within the patent warranted hereon all changes and modifications as reasonably and properly come within the scope of his or her contribution to the art.

I claim as my invention:

1. A method for contiguous large imaging in magnetic resonance tomography with continuous table displacement of a table on which an examination subject is supported, said method comprising the steps of:

operating a magnetic resonance data acquisition unit to acquire a magnetic resonance tomography overview image along a body axis, selected from the group consisting of the sagittal axis and the coronal axis, of an examination subject on a patient table with continuous displacement of the patient table in a movement direction along a longitudinal direction of the body of the examination subject;

in a processor, establishing a planning field of view (FOV) by selectively circumscribing an individual anatomical region of interest of a selected size within the body of the examination subject depicted in the overview image;

using said processor, planning a configuration of multi-dimensional radio-frequency (RF) excitation volumes of the examination subject with the planning FOV completely overlapped along said body axis by an entirety of the RF examination volumes;

radiating slice-selective RF excitation pulses into the examination subject, with continuous displacement of said patient table, into successive segments of the examination subject encompassed by said RF excitation volumes, to excite nuclear spins successively in said segments, and successively reading out magnetic resonance signals from said segments arising from the excited nuclear spins therein; and shifting at least two of said multi-dimensional RF excitation volumes with respect to each other in a direction orthogonal to said movement direction to cause a focal point of said RF excitation volumes to be on a center line of said planning FOV.

2. A method as claimed in claim 1 wherein said magnetic resonance signals have a phase associated therewith, and wherein said longitudinal direction coincides with the z-direction of a Cartesian coordinate system, and manipulating said phase of said magnetic resonance signals to vertically vary said RF excitation volumes in the y-direction of said Cartesian coordinate system according to $$\hat{S}_n(k_y,x) = S_n(k_y,x)e^{-ik_y y_n}$$

wherein n=1, . . . , N, wherein N is the number of said RF excitation volumes, $S_n(k_y, x)$ represents a magnetic resonance signal acquired according to a standard acquisition, and $e^{-i k_y}$, $y_n$ represents a phase factor for said vertical adjustment in said y-direction.

3. A method as claimed in claim 1 comprising planning said RF excitation volumes so that respective widths of said RF excitation volumes are equal along said body axis.

4. A method as claimed in claim 1 comprising planning said RF excitation volumes so that respective heights of said RF excitation volumes are equal along said body axis.

5. A method as claimed in claim 1 comprising planning said RF excitation volumes in said processor by making manual entries into said processor via an interface of said processor to dimension the respective RF excitation volumes dependent on said planning FOV.

6. A method as claimed in claim 1 comprising continuously varying an orientation of said center line of said planning FOV.

7. A method as claimed in claim 1 comprising adjusting imaging parameters individually for each of said segments for excitation of said nuclear spins therein and acquisition of said magnetic resonance signals therefrom.

8. A magnetic resonance apparatus for contiguous large imaging with continuous table displacement of a table on which an examination subject is supported, comprising:

a magnetic data acquisition unit having a displaceable patient table adapted to receive an examination subject thereon;

a computerized control and processing system configured to operate said magnetic resonance data acquisition unit to acquire a magnetic resonance tomography overview image along a body axis, selected from the group consisting of the sagittal axis and the coronal axis, of the examination subject on the patient table with continuous displacement of the patient table in a movement direction along a longitudinal direction of the body of the examination subject;

said computerized control and processing system being configured to establish a planning field of view (FOV) by selectively circumscribing an individual anatomical region of interest of a selected size within the body of the examination subject depicted in the overview image;

said computerized control and processing system being configured to plan a configuration of multi-dimensional radio-frequency (RF) excitation volumes of the examination subject with the planning FOV completely overlapped along said body axis by an entirety of the RF examination volumes;

said computerized control and processing system being configured to operate said data acquisition unit to radiate slice-selective RF excitation pulses into the examination subject, with continuous displacement of said patient table, into successive segments of the examination subject encompassed by said RF excitation volumes, to excite nuclear spins successively in said segments, and successively reading out magnetic resonance signals from said segments arising from the excited nuclear spins therein; and said computerized control and processing system being configured to shift at least two of said multi-dimensional RF excitation volumes with respect to each other in a direction orthogonal to said movement direction to cause a focal point of said RF excitation volumes to be on a center line of said planning FOV.

9. A non-transitory computer-readable medium encoded with programming instructions, said medium being loaded into a computerized control and processing system of a magnetic resonance apparatus, having a magnetic resonance data acquisition unit with a displaceable patient table adapted to receive an examination subject thereon, and said programming instructions causing said computerized control and processing system to:

operate the magnetic resonance data acquisition unit to acquire a magnetic resonance tomography overview image along a body axis, selected from the group consisting of the sagittal axis and the coronal axis, of the examination subject on the patient table with continuous displacement of the patient table in a movement direction along a longitudinal direction of the body of the examination subject;

establish a planning field of view (FOV) by selectively circumscribing an individual anatomical region of interest of a selected size within the body of the examination subject depicted in the overview image;

plan a configuration of multi-dimensional radio-frequency (RF) excitation volumes of the examination subject with the planning FOV completely overlapped along said body axis by an entirety of the RF examination volumes;

operate the data acquisition unit to radiate slice-selective RF excitation pulses into the examination subject, with continuous displacement of said patient table, into successive segments of the examination subject encompassed by said RF excitation volumes, to excite nuclear spins successively in said segments, and successively reading out magnetic resonance signals from said segments arising from the excited nuclear spins therein; and operate the data acquisition unit to shift at least two of said multi-dimensional RF excitation volumes with respect to each other in a direction orthogonal to said movement direction to cause a focal point of said RF excitation volumes to be on a center line of said planning FOV.

* * * * *